United States Patent
Seefeldt

(10) Patent No.: US 7,423,492 B2
(45) Date of Patent: Sep. 9, 2008

(54) CIRCUIT TO RESET A PHASE LOCKED LOOP AFTER A LOSS OF LOCK

(75) Inventor: James D. Seefeldt, Eden Prairie, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/254,474

(22) Filed: Oct. 20, 2005

(65) Prior Publication Data

US 2007/0090881 A1  Apr. 26, 2007

(51) Int. Cl.
*H03L 7/095* (2006.01)

(52) U.S. Cl. .................. 331/25; 331/DIG. 2; 331/1 A; 327/157

(58) Field of Classification Search .............. 331/14, 331/18, 25, 34, 62, 1 A, 175, 177 R, DIG. 2; 327/156, 157
See application file for complete search history.

(56) References Cited

U.S. PATENT DOCUMENTS

| | | | |
|---|---|---|---|
| 4,479,091 A | 10/1984 | Yoshisato | |
| 5,686,864 A * | 11/1997 | Martin et al. | 331/1 A |
| 6,256,362 B1 | 7/2001 | Goldman | |
| 6,441,691 B1 | 8/2002 | Jones et al. | |
| 6,683,930 B1 | 1/2004 | Dalmia | |
| 6,703,880 B1 * | 3/2004 | Gailhard et al. | 327/159 |
| 6,856,202 B2 | 2/2005 | Lesso | |
| 2003/0179024 A1 | 9/2003 | Montagnana | 327/156 |
| 2004/0061534 A1 | 4/2004 | Katoh et al. | 327/156 |
| 2004/0263224 A1 | 12/2004 | Schrodinger | 327/156 |

FOREIGN PATENT DOCUMENTS

EP  1 406 389 A1  7/2004

OTHER PUBLICATIONS

U.S. Appl. No. 11/254,281, filed Oct. 20, 2005, Jeffrey J. Kriz.
U.S. Appl. No. 11/254,569, filed Oct. 20, 2005, James D. Seefeldt, et al.
U.S. Appl. No. 11/254,474, filed Oct. 20, 2005, James D. Seefeldt.
U.S. Appl. No. 11/254,466, filed Oct. 20, 2005, James D. Seefeldt.
Dong Pan, et al, "A Radiation-Hard Phase-Locked Loop," IEEE 2003, pp. 1-6, Jun. 2003.

* cited by examiner

*Primary Examiner*—Robert J. Pascal
*Assistant Examiner*—Ryan J. Johnson
(74) *Attorney, Agent, or Firm*—McDonnell Boehnen Hulbert & Berghoff LLP

(57) ABSTRACT

A system and method for generating a reset signal within a Phase Locked Loop (PLL) circuit is described. The reset signal is generated by inputting a reference signal and a lock detect signal into reset circuitry. The reset circuitry within the PLL comprises a series of interconnected latches, or D flip-flops, which are used to create a delay time. The delay time is the amount of time the reset circuit will wait until the reset signal indicates a reset. The reset circuit may also generate a reset signal having a pulse width. The pulse width is determined by the series of interconnected latches. The reset signal may be used to reset a Voltage Controlled Oscillator (VCO) or other circuits within a PLL or it may be used by circuits external to the PLL.

20 Claims, 3 Drawing Sheets

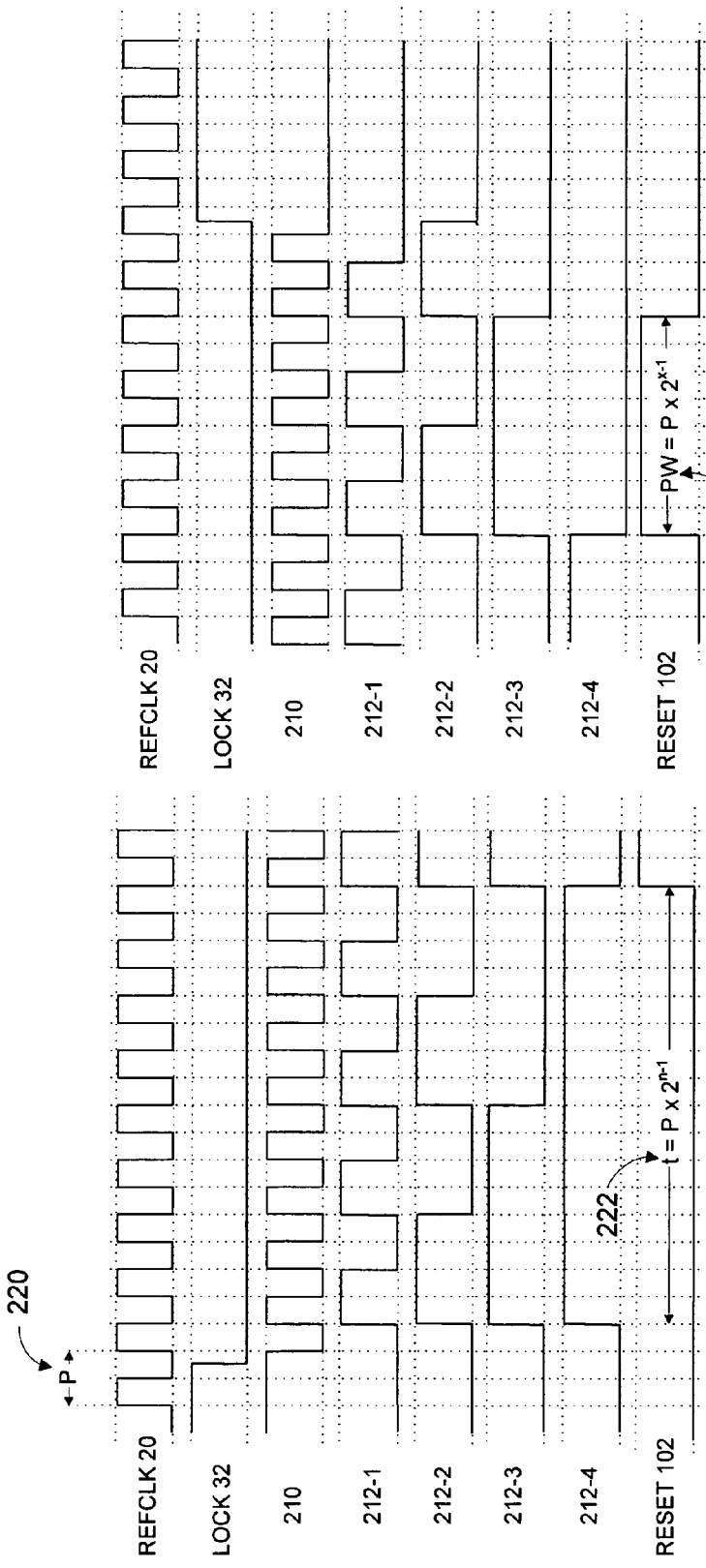
Fig. 3a
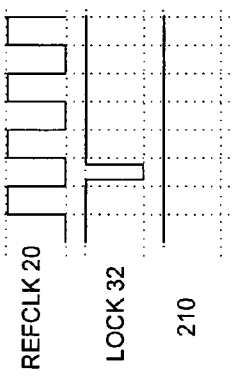
Fig. 3b
Fig. 3c

CIRCUIT TO RESET A PHASE LOCKED LOOP AFTER A LOSS OF LOCK

GOVERNMENT RIGHTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to alignment of periodic signals, and more particularly, the resetting of phase locked loops, delay locked loops, clock and data recovery circuits, etc.

BACKGROUND

Phase locked loops ("PLL") have been used extensively in analog electrical systems and communication systems. In today's high performance systems operating within increasingly stringent timing constraints, PLLs are being introduced in more general digital electronic circuits. For example, Application Specific Integrated Circuits (ASICs) used in a variety of circuit applications typically include on-chip PLLs for clock signal distribution.

The key advantages that PLLs bring to clock distribution are phase/delay compensation, frequency multiplication and duty cycle correction. A PLL enables one periodic signal or clock to be phase-aligned to frequency multiples of a reference clock. As the name implies, the output of the PLL locks onto the incoming reference clock signal and generates a periodic output signal with a frequency equal to the average frequency of the reference clock. When the output PLL signal tracks the reference signal, the PLL is said to be "locked."

A PLL, however, will only remain locked over a limited frequency range or shift in frequency called a hold-in or lock range. The PLL generally tracks the reference signal over the lock range, provided the reference frequency changes slowly. This maximum "locked sweep rate" is the maximum rate of change of the reference frequency for which the PLL will remain locked. If the frequency changes faster than this rate, the PLL will drop out of lock.

Other factors may cause loss of lock that may occur unexpectedly and suddenly. For example, Single Event Transients (SETs) caused by particle radiation (not uncommon in aerospace applications) may disrupt the PLL circuit and cause loss of lock. Integrated circuits used in space, weapons, or aviation applications are more likely to be exposed to such charged particle radiation. Particle-induced circuit disturbances are random and are commonly referred to as Single Event Effects (SEEs). SEEs can take on many forms. If the particle strike results in a bit flip or other form of corruption of stored data, this is known as a Single Event Upset (SEU), or a soft error. If the particle causes a transient voltage disturbance on a node of a logic circuit, this is known as an SET. If the node is in a clock network, a temporary voltage disturbance on a circuit node can generate a false clock pulse in a portion of the system. If undetected, loss of lock may disrupt and interfere with circuit operation.

To detect a loss of lock, lock detectors are utilized. Lock detectors typically monitor the reference clock and the PLL output signal. The frequencies of these two signals are compared. If the frequencies match, the PLL is determined to be locked. Unfortunately, even though a lock detector may flag an error event, some of the components of a PLL may still be affected adversely when a PLL falls out of lock. One component that may be affected is the voltage controlled oscillator (VCO). A VCO is used to create a PLL output signal with a periodic waveform. As the name implies, a VCO outputs a signal with a frequency indicative of an input voltage signal.

When a lock condition in the PLL is lost, the VCO may continue to output a signal. Under normal operation, this signal is used to create a feedback signal that is used to determine the amount of voltage that should be applied to the VCO in order to maintain a desired output. However, when a PLL loses lock, this feedback signal may deviate from normal operation. Using the feedback signal for feedback, the VCO may also increase or decrease to the point that it is out of a normal operating range. If this occurs, circuits that rely on the PLL may be adversely affected.

One example of a VCO deviating out of normal operation may occur when a SEE causes a capacitor within a charge pump to discharge. Discharging the capacitor may cause a significant deviation in a PLL output signal. Correspondingly, a loss of lock may be flagged. Despite the flagged loss of lock, the VCO may continue to produce a signal having a waveform that is increasing in frequency. Eventually circuits that employ the PLL, such as an ASIC, as well as the PLL will need to be globally reset in order to return to a normal operating condition.

In some circumstances, however, a PLL may recover without having to reset the PLL or circuits that depend on the PLL. Some SET events may cause a disruption for only one cycle of the PLL. This may not be significant enough to cause a VCO to deviate into an undesirable operating range. The VCO may recover naturally in a short amount of time. Thus, there is a need for a circuit that appropriately resets a phase locked loop, or VCO, after lock has been lost for a predetermined amount of time.

SUMMARY

A system and method for resetting a phase locked loop ("PLL") circuit is described.

In one embodiment, a PLL comprises a reset circuit that receives a reference clock signal and a lock detect input. In another embodiment, a series of interconnected latches, or flip-flops are used to create a delay time. Once, the reset circuit measure that a lock condition has not been met for a time greater than the delay time, a reset signal is generated. The delay time is determined by the number of interconnected latches. Essentially, the period of the reference clock signal is multiplied by the series of interconnected flip-flops. The multiplied period is used to create the delay time.

In yet another embodiment, a pulse width of the reset signal is set by coupling an output signal from the series of the interconnected latches to pulse shaping circuitry. The pulse width may be adjusted by selecting an appropriate output signal from the interconnected flip-flops.

In a further embodiment, the reset signal is coupled with a Voltage Controlled Oscillator (VCO) within the PLL. If the reset signal represents a reset condition, the voltage controlled oscillator may be pulled to a reset frequency. In other embodiments, the reset signal may be used by other circuits within the PLL. Or, the reset signal may be output to circuits external to the PLL.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 3a is a timing diagram illustrating reset signal generation after a loss of lock;

FIG. 3b is a timing diagram illustrating a transient loss of lock detect signal not triggering the reset signal generation; and FIG. 3c is a timing diagram illustrating an example of adjusting the pulse width of a reset signal.

DETAILED DESCRIPTION

As presented above, there is a need for a circuit that resets a Phase Locked Loop (PLL) when a loss of lock condition occurs. Conventional PLLs can deviate from normal output frequencies when lock is lost. Typically this is due to an output signal from a voltage controlled oscillator (VCO) within the PLL deviating to a frequency that is above or below its normal frequency. Once the output signal deviates, external circuits as well as the PLL may need to be reset. Often times, however, it is disadvantageous to reset external circuits that are employing the PLL. In addition, when the PLL is reset, the reset may occur much later than the loss of lock event. These disadvantageous aspects of conventional PLLs result in undesirable delays and errors within the PLL and external circuitry using the PLL.

In a loss of lock event such as those that occur from Single Event Effects (SEE), which include Single Event Upsets (SEU) or Single Event Transients (SET), a reset circuit for use in a PLL is presented that determines when a lock condition is lost and when to reset the PLL (or a VCO within the PLL). The reset circuit prevents undesirable delays or errors that may normally occur when a PLL loses lock. In addition to SEE events, the reset circuit may be used for other loss of lock events. For example, a loss of lock may occur when a reference clock signal inadvertently deviates in frequency because the reference clock signal is unstable. Many other circumstances for loss of lock exist. It is the object of the present invention, therefore, to effectively reset a PLL in order to regain a stable PLL output signal after a loss of lock occurs.

Figure 1:
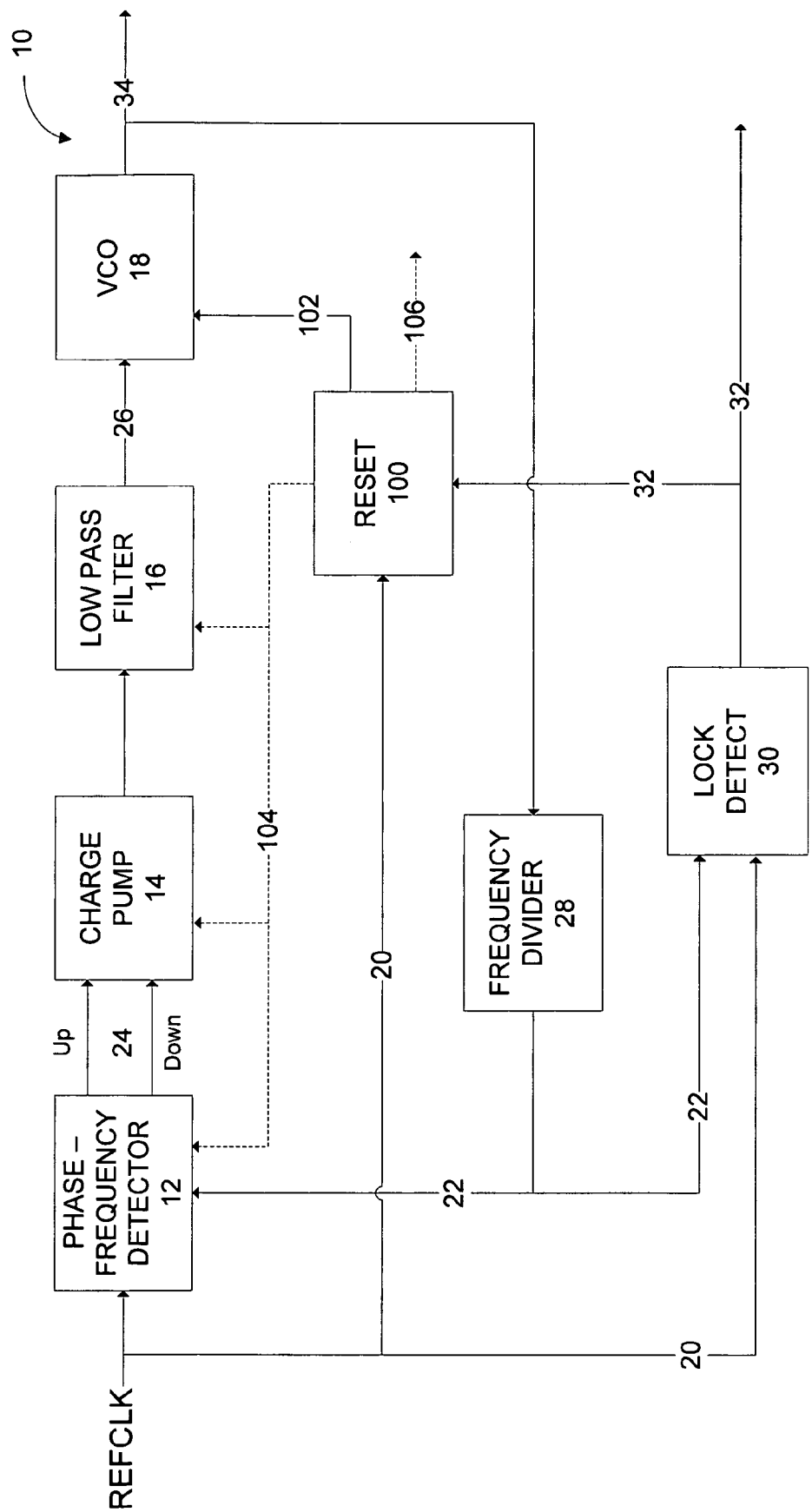
FIG. 1a is a block diagram of a phase locked loop including a reset circuit.

Turning now to FIG. 1, an example PLL 10 includes a phase-frequency detector 12, a charge pump 14, a low pass filter 16, a VCO 18 and a lock detector 30. The phase-frequency detector 12 receives a reference clock signal REFCLK on signal line 20 and a derived (or feedback) clock signal (FBKCLK) on signal line 22. An output signal from the phase-frequency detector 12 is supplied to the charge pump 14. An output signal from the charge pump 14 is coupled to low pass filter 16. Low pass filter 16 is coupled, with the VCO 18. The VCO 18 output signal in supplied to frequency divider 28. The output signal of frequency divider 28 is coupled with phase-frequency detector 12 and lock detector 30. The lock detector 30 is also supplied with REFCLK in order to provide the lock detect signal (LOCK) on signal line 32. Reset circuit 100 receives REFCLK and LOCK on respective signal lines 22 and 32. Reset circuit 100 outputs a reset signal (RESET) is coupled to VCO 18 via signal line 102. Also illustrated in this example, multiple reset signals on signal lines 104 and 106 may be coupled with components within PLL 10, or output to external circuits.

In operation, the phase detector 12 compares the frequencies of two input signals and generates an output that is a measure of the phase difference of the two input signals. For instance, the phase-frequency detector compares REFCLK with FBKCLK and generates an error signal on signal line 24 which is proportional to the magnitude of the phase/frequency difference between REFCLK and FBKCLK. For purpose of illustration, the error signal of the phase detector 12 may comprises up or down signals or pulses that the charge pump 14 is coupled to receive.

The error signal on signal line 24 is sent to the charge pump 14 to alleviate the loading of the phase detector 12 on the PLL circuitry. The charge pump 14 current controls the magnitude of the charge stored in the low pass filter 16, thus converting the phase-frequency detector 12 error signal to a control voltage signal on signal line 26 which is coupled to the VCO 18. The VCO 18 generates an output signal having a frequency that is proportional to the control voltage signal.

When the PLL 10 is locked, there is a constant phase difference (usually zero) between REFCLK and FBKCLK and their frequencies are matched. If the two signals are equal, there may be no error signal on signal line 24. If the signals differ, the phase detector 12 ultimately produces the control voltage signal on signal line 24. If FBKCLK falls behind REFCLK, the phase detector 12 causes the charge pump 14 to change the control voltage signal, so that the VCO 18 speeds up. Likewise, if FBKCLK creeps ahead of REFCLK, the phase detector 12 causes the charge pump 14 to change the control voltage signal so as to slow down VCO 18. The low pass filter 16 smooths out the abrupt voltage control signals from the charge pump 14, so that the PLL 10 tends towards a state where the phase detector 12 makes very few corrections. The result is a stable PLL output signal on signal line 34 which can be used in a variety of integrated circuit applications. One such application may be a clock generation circuit.

There are many circumstances, however, when the PLL 10 will not be able to produce a stable output signal. The lock detect 30 indicates when a stable output signal is or is not being output by measuring the REFCLK and FBKCLK signals. If there is not a stable output, lock detect 30 will use LOCK to indicate a lock condition not being met.

One such circumstance that may cause a lock condition to not be met may be REFCLK having too low or high of an input frequency. In PLL circuits, VCOs are often designed to operate in a given frequency range. If REFCLK has too low of a frequency, for example, a VCO may output a signal that is pinned at the lowest operable frequency of the VCO. The lowest operable frequency of the VCO 18 may be higher in frequency than the REFCLK frequency. Thus, the FBKCLK frequency will be higher than the REFCLK frequency. When the lock detect 30 evaluates the REFCLK and FBKCLK signals it will discriminate a difference in output frequencies and indicate, via LOCK, a "non-lock" condition.

As the PLL is outputting a signal on signal line 34 and LOCK, reset circuit 100 monitors both REFCLK and LOCK. If a lock is detected, reset 100 outputs a RESET with a "low" value on signal line 102. However, if LOCK indicates loss of lock, reset circuit 100 will start to measure the amount of time lock has been lost. If the PLL recovers within a predetermined amount of time, then RESET will remain "low". However, if lock is not met within the predetermined amount of time, RESET will go "high". It is also important to note that the PLL may be designed so that a "low" value of RESET indicates a reset for the VCO 18. The embodiments of the present invention are not limited to the type, or level of the voltage of the RESET signal. In other embodiments RESET may also be a current signal.

Upon receiving a "high" RESET signal, the VCO will reset. The VCO 18 may be reset to any particular frequency. If a particular application using the PLL uses only the high frequencies offered by the VCO 18, the VCO 18 may be designed to reset to a high frequency. Alternatively, a frequency may be set to a mid range or a low frequency value.

An example PLL 10 may be used in a clock generation circuit that cycles at about 1 GHz. During a SEU event, the PLL 10 may lose lock and may not be able to regain normal output. Lock may not be regained for reasons that include the VCO 18 deviating to a frequency outside of normal operating range. As discussed above, if the VCO 18 is able to recover to the desired frequency (i.e., 1 Ghz), the time that it takes to regain lock may nevertheless be undesirable. Or, the VCO 18 may not be able to recover to a given frequency. In either event, the reset circuit 100 may then use RESET to reset the VCO 18. If, for example, the VCO 18 deviated to a frequency of 0.5 Ghz, RESET may be used to reset VCO 18 to a frequency closer to 1 GHZ. As described above, the frequency of VCO 18 upon receiving a reset, via RESET, may be predetermined in the design of VCO 18.

Also previously mentioned, the reset circuit 100, may also comprise output signals on signal lines 104 and 106. These signals may be useful for resetting circuitry within the PLL 10 or external circuitry. For example, it may be beneficial to reset the charge pump 14 if a lock cannot be regained. Resetting the charge pump 14 may include charging or discharging capacitors within charge pump 14. Or, it may be useful for external circuitry to be updated if the PLL 10 has been reset. The signal on signal line 106 could be used in this example. The functionality of the reset circuit is not limited to only resetting the VCO 18.

Figure 2:
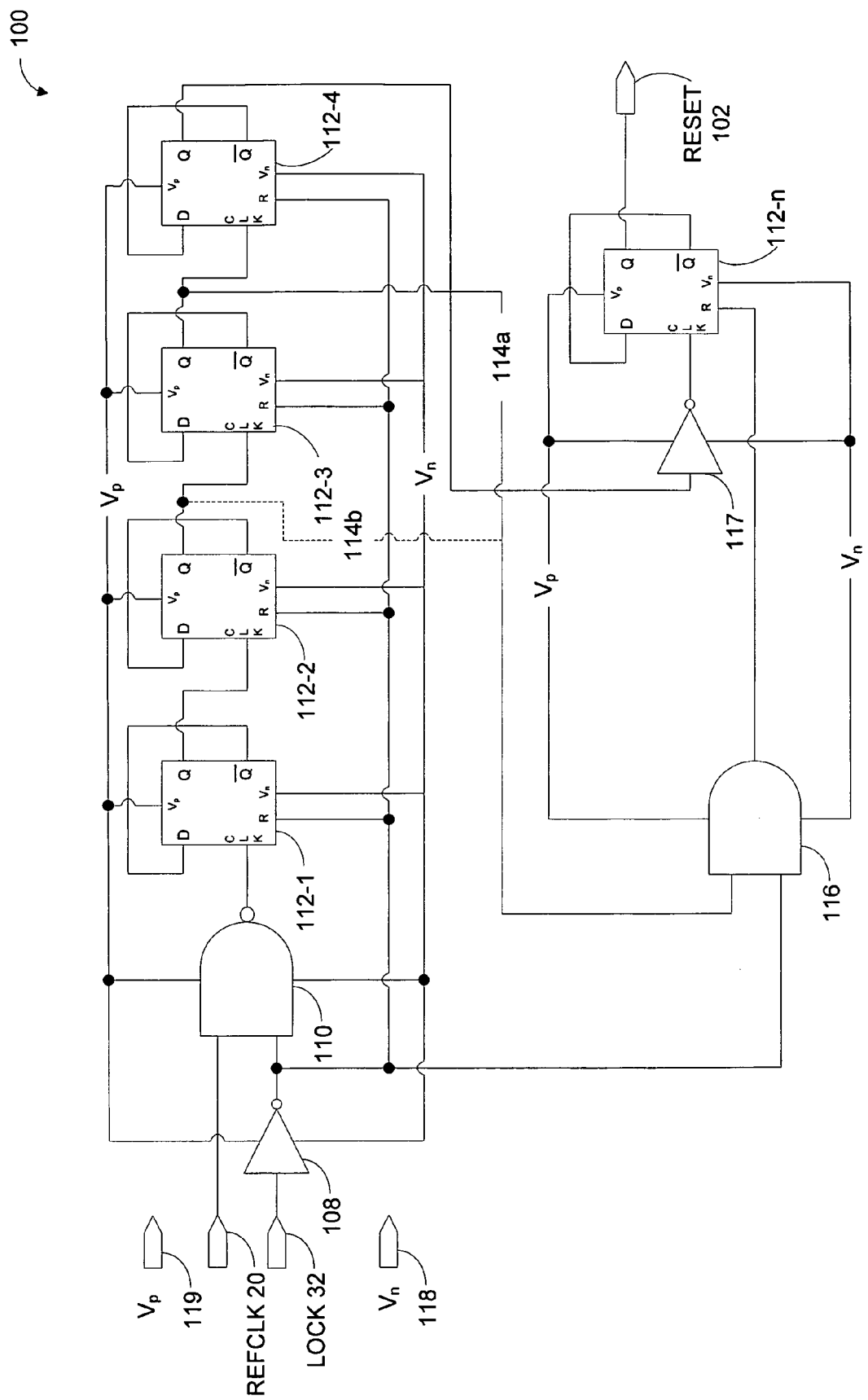
FIG. 2 is a circuit diagram of a reset circuit.

In order to demonstrate how reset circuit 100 generates RESET, a circuit diagram of one embodiment of reset 100 is illustrated in FIG. 2. Reset 100 is coupled to receive REFCLK and LOCK as input and RESET is output. LOCK is inverted at inverter 108. The output of inverter 108 and REFCLK are NANDed by NAND gate 110. The output of inverter 108 is also coupled with the reset inputs of D flip-flops 112-1-112-4. The irsoutput of NAND gate 110 is coupled with the clock input of D flip-flops 112-1-112-n.

D flip-flops 112-1-112-n are interconnected, wherein each D flip-flop in the series of D flip flops 112-1-112-n, has an inverted output coupled with its D input. All of the D flip-flops, save 112-1 and 112-n, have an output coupled to a clock input of the subsequent D flip-flop and receive as clock input the output from the preceding D-flip flop. For example, in this embodiment, D flip-flop 112-2 receives the Q output from D flip-flop 112-1 as clock input and outputs a Q output into a clock input of D flip-flop 112-3.

A reset pulse shaping tap, drawn as signal line 114a is taken from the Q output of D-flip flop 112-3. The reset pulse shaping tap 114a is ANDed with the output of inverter 108 at AND gate 116. For purposes of illustration, a phantom reset pulse shaping tap, drawn as signal line 114b is taken from the Q output of D flip-flop 112-2. The reset pulse shaping tap 114b is shown in order to convey that a reset pulse shaping tap may also be placed at the output of any of the D flip-flop outputs 112-1-112-n. The purpose of the reset pulse shaping taps 114a and 114b is described with reference to FIG. 3c.

The output of AND gate 116 is coupled with the reset input of D flip-flop 112-n. D flip-flop 112-n also receives as clock input the inverted output of the D flip-flop that preceded it. In this embodiment the preceding D flip-flop is D flip-flop 112-4 and inverter 117 is used to invert its Q output. Other embodiments of the present invention may include more or less D flip-flops, or other types of flip-flops or latches. RESET at output 120 is taken from the Q output of D flip-flop 112-n.

Also illustrated in FIG. 2 are common voltage $V_n$ 118 and power supply voltage $V_P$ 119. Both $V_n$ 118 and $V_P$ 119 may be used to supply power to circuitry within reset circuit 100. However, various power supply components or methods may be used.

In operation, the generation of RESET can be understood by observation of FIGS. 3a-c. As illustrated in FIG. 3a, when a lock condition is met, the Q output of D flip-flip 112-n, RESET, is "low". When LOCK is lost, as illustrated in FIG. 3a, the AND gate 110 output signal, represented by trace 210, begins to track REFCLK.

REFCLK has a known period ("P") 220. As trace 210 tracks REFCLK, the period 220 of REFCLK is subsequently multiplied by D flip-flops 112-1-112-n. Ultimately, the multiplication of the period 220 produces a delay time ("t") 222. The delay time 222 is predetermined by the number "n" of interconnected D flip-flops used in the reset circuit 100.

Multiplication of the period 220 and creation of delay time 222 is described as follows. Upon receiving a rising edge of trace 210, D flip-flop 112-1 outputs a signal represented by trace 212-1. Essentially, trace 212-1 is similar to REFCLK, except that the period of trace 212-1 is a factor of 2 larger and the phase is shifted 180 degrees. In a similar manner, the output signals of D flip-flops 112-2-112-4, respectively represented by traces 212-2-212-4, are multiples of a received input signal. For example, trace 212-1 represents the signal input into the clock input of D flip-flop 112-2. The D flip-flop 112-2 output signal, represented by trace 212-2, has a period that is twice as large as the period of trace 212-1. Depending on the number of flip-flops used, the delay time 222 can be tailored to a circuit designer's preference. In this embodiment, the number of flip-flops used is 5. Accordingly, the delay time 222 is calculated by the following equation:

$$t = P \times 2^{n-1}$$

If the frequency of REFCLK is 500 MHz, for example, the period 222 would be 2 ns. The delay time 222, in this embodiment, would be 32 ns. If, however, more flip flops are added to the reset circuit 100, the delay time 222 may be increased. 10 interconnected D flip-flops would create a delay time 222 of 1 μs, for example. In some embodiments reset circuit 100 may be viewed as a timer. The delay time 222 is the amount of time that must pass before the timer sends a RESET signal indicating a reset.

As discussed above, a lock condition may be regained within the delay time 222. In some instances, the loss of lock may be transient or shorter than delay time 222. When a lock is lost for only a short amount of time, a PLL, or VCO within the PLL may be able to recover without a reset being indicated by RESET. The loss of lock may be lost and recovered within only a few cycles of REFCLK. FIG. 3b illustrates one example of loss and recovery of lock. In FIG. 3b, LOCK goes "low" on a "low" cycle of REFCLK. LOCK returns to a "high" value before REFCLK goes "high" again. Trace 210 does not begin to track REFCLK as it does in FIG. 3a. Thus, RESET will not indicate a reset condition. If LOCK goes "low" for a limited amount of time (i.e., a time shorter than delay time 222), signal 210 may begin to track REFCLK. However, upon regaining lock, D flip-flops 112-1-112-4 will be reset, preventing RESET from indicating a reset condition.

In some instances, a circuit designer may desire to adjust the pulse width of RESET (i.e., the width of the pulse indicating a reset). Depending on the application, some VCOs, or other circuits components may take more time to reset than other circuit components. For example, a VCO that outputs a 1 GHz waveform may be able to reset in a manner of nanoseconds. Whereas a VCO that outputs a 10 MHz signal may reset on the order of microseconds. Reset pulse shaping taps 114a, 114b may be used to adjust the amount of time RESET stays "high", or indicates a reset.

A reset shaping pulse is illustrated in FIG. 3c. In this example, LOCK starts out "low". A "high" RESET signal is generated when traces 212-4 goes "low". AND gate 116 outputs the logical AND of the inverse of LOCK and trace 212-3. This output will reset latch 112-n when it goes "low". Therefore, when RESET goes "high", it is eventually pulled "low" when latch 112-n is reset by the "low" output of AND 116. The pulse width ("PW") 224, of the RESET is half the period of signal 212-3. PW is calculated as follows, wherein "x" is the placement of a flip-flop in the series of D flip-flops (in this embodiment x=3):

$$PW=P\times 2^{x-1}$$

As an example, a REFCLK having a 1 GHz frequency (a period of 2 ns) would have a RESET pulse width 224 of 8 ns.

In another embodiment, the pulse width can be decreased by connecting reset pulse shaping tap 114b, as is shown in FIG. 2, to signal 212-2. If a 1 GHz REFCLK were used, the pulse width 224 would be 4 ns. Alternatively, if more flip-flops are used, a pulse shaping tap may be placed at the $8^{th}$ consecutive flip-flip, for example. The pulse width 224 in this example would be 0.25 µs.

If AND gate 116 is excluded from reset circuit 100, the pulse width would be set by the $n^{th}$ flip flop. That is, the pulse width would default to half the delay time 222. An embodiment without AND gate 116 may be useful for circuits that require a large pulse width 224. Or, if a larger pulse width 224 is desired, AND gate 116 may be replaced with other circuitry that would allow the pulse width 224 to be increased to any desired width.

As disclosed above, the D flip-flops used in the above embodiments are rising edge triggered, but any type of flip flop or latch may be used, including multi-input flip-flops or latches. Also, the signals in the timing diagrams of FIGS. 3a-c are drawn as square waveforms, it is to be understood, however, that the signals may take on a variety of waveforms, such waveform include sinusoidal, triangular or any various other shaped pulses. Although the signals in this embodiment are represented as "high" or "low", the functionality of the described signals is not limited to exclusively "high" or "low" voltages. The signals lines in the above embodiment may be inverted or comprise a plurality of operating voltage or currents.

The PLL and reset circuit of the present embodiments can take many forms. Many of the logical operations can be performed by various combinations of a plurality of logic gates and components. For many applications embodiments of the invention may be implemented on a DSP (Digital Signal Processor), ASIC or FPGA (Field Programmable Gate Array). In a preferred embodiment, the lock detect is realized in an application specific integrated circuit or "ASIC" customized to perform specific functions for a particular use or uses. The embodiments could also be implemented in software in software phase locked loops. These loops implement the PLL using software equivalents for each of the blocks. These phase locked loops would typically be run on a DSP or microprocessor. Software PLLs are becoming more popular mainly due to the availability of cheap and easy to program DSPs.

As such, the above-described apparatus and methods may be embodied as software code, for example on a carrier medium such as a disk, CD- or DVD-ROM, programmed memory such as read only memory (Firmware), or on a data carrier such as an optical or electrical signal carrier. Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog or VHDL (Very high speed integrated circuit Hardware Description Language). As the skilled person will appreciate, the code may be distributed between a plurality of coupled components in communication with one another. Where appropriate, the embodiments may also be implemented using code running on a field-(re-)programmable analog array or similar device in order to configure analog hardware.

The above embodiments describe a PLL that comprises a reset circuit. As presented above, the reset circuit within a PLL is used to reset the PLL when a loss of "lock" condition occurs. Resetting the PLL may comprise, pulling a VCO within the PLL to a predetermined frequency value. Predetermined frequency values may comprise low, high, or mid range operating frequencies. Other circuits, internal or external to the PLL may also be reset upon generation of a reset signal. The properties of the reset signal may also be determined by the reset circuit. Features such as delay time or reset pulse width are example of such determinable properties. It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A Phase Locked Loop (PLL) with reset capability, the PLL comprising:
 a PLL, wherein the PLL is coupled to receive reference and feedback signals; and
 reset circuitry, wherein the reset circuitry is coupled to receive the reference signal and a lock detect signal, wherein, in operation, the reset circuit starts a reset timer when the lock detect signal indicates a loss of lock condition, wherein, in operation, the reset circuit outputs a reset signal indicating a reset when the lock detect signal indicates a loss of lock condition for a preset amount of time, and wherein, in operation, if the lock detect indicates a lock condition before the preset amount of time, the reset circuit resets the reset timer.

2. The PLL of claim 1, further comprising a Voltage Controlled Oscillator (VCO) coupled to receive the reset signal.

3. The PLL of claim 1, wherein the reset circuitry further comprises:
 a logic circuit having first and second inputs and an output, the first input coupled to receive the reference signal and the second input coupled to receive the lock detect signal; and
 interconnected latches having an input and an output, the input coupled with the output of the logic circuit and the output of the interconnected latches outputting the reset signal.

4. The PLL of claim 2, wherein upon the reset signal indicating the reset, the VCO is configured to output a periodic signal with a frequency of about mid-range between a maximum and a minimum frequency available to the VCO.

5. The PLL of claim 2, wherein upon the reset signal indicating the reset, the VCO is configured to output a periodic signal with a frequency having a preset value.

6. The PLL of claim 5, wherein the preset value is about a maximum frequency value available to the VCO.

7. The PLL of claim 5, wherein the preset value is about a minimum frequency value available to the VCO.

8. The PLL of claim 3, wherein the reset circuitry further comprises:
   a pulse shaping tap coupled with a latch output of one of the interconnected latches; and
   a pulse shaping circuit coupled with the lock detect input and the pulse shaping tap, wherein the pulse shaping circuit resets the interconnected latches thereby determining a pulse width of the reset signal.

9. The PLL of claim 8, wherein the interconnected latches are interconnected D flip-flops.

10. A method of operating a reset capability for a phase locked loop (PLL), the method comprising:
    coupling a reference signal and a lock detect signal with reset circuitry;
    when the lock detect signal indicates a loss of lock, starting a reset timer within the reset circuitry;
    when the reset timer exceeds a preset time value, outputting a reset signal from the reset circuitry that indicates a reset; and
    when if the lock detect signal indicates a lock before the preset time value is exceeded, resetting the timer within the reset circuitry.

11. The method of claim 10, further comprising when the reset signal indicates the reset, resetting a Voltage Controlled Oscillator (VCO).

12. The method of claim 11, wherein resetting the VCO comprises setting the frequency of an output signal of the VCO to a predetermined frequency value.

13. The method of claim 10, wherein starting the reset timer comprises:
    determining the preset time value by coupling a series of latches so as to create a series of interconnected latches;
    when the lock detect signal indicates a loss of lock, increasing the period of the reference signal within the reset circuitry by the series of interconnected latches; and
    when the reference signal at the last latch within the series or interconnected latches changes state, outputting the reset signal indicating the reset.

14. The method of claim 13, further comprising:
    coupling an output of one of the interconnected latches within the series of interconnected latches and the reference signal with a logic circuit; and
    shaping the pulse of the reset signal by resetting the series of interconnected latches with an output signal of the logic circuit, the output signal of the logic circuit being coupled with the series of interconnected latches.

15. A method of manufacturing a Phase Locked Loop (PLL) with reset capability, the method comprising:
    coupling a reference output and a lock detect output with reset circuitry that starts a reset timer when the lock detect signal indicates a loss of lock condition, wherein the reset circuit provides a reset signal indicating a reset when the lock detect signal indicates a loss of lock condition for a preset amount of time, and wherein the reset circuit resets the reset timer if the lock detect signal indicates lock before the preset amount of time is exceeded; and
    providing the PLL with an output from the reset circuitry so as to supply the reset capability.

16. The method of claim 15, wherein the output from the reset circuitry is coupled with a reset input of a Voltage Controlled Oscillator (VCO).

17. The method of claim 15, further comprising:
    coupling the reference output and the lock detect output to a logic circuit within the reset circuitry; and
    coupling an output of the logic circuit with an input of a series interconnected latches, wherein the series of interconnected latches has an output that provides the reset signal.

18. The method of claim 17, wherein the output of the series of interconnected latches is coupled with a reset input of a Voltage Controlled Oscillator (VCO).

19. The method of claim 18, wherein the VCO is configured to be set to a predetermined frequency upon receiving the reset indicated by the reset signal.

20. The method of claim 17, further comprising:
    coupling a second output of the series of interconnected latches to an input of a pulse shaping logic circuit; and
    coupling an output of the pulse shaping circuit to a reset input of the series of interconnected latches so as to shape the signal pulse of the reset signal.

* * * * *